(12) United States Patent
Cole

(10) Patent No.: US 6,633,894 B1
(45) Date of Patent: Oct. 14, 2003

(54) SIGNAL PROCESSING ARRANGEMENT INCLUDING VARIABLE LENGTH ADAPTIVE FILTER AND METHOD THEREFOR

(75) Inventor: Terry Lynn Cole, Austin, TX (US)

(73) Assignee: Legerity Inc., Austin, TX (US)

( * ) Notice: Subject to any disclaimer, the term of this patent is extended or adjusted under 35 U.S.C. 154(b) by 1040 days.

(21) Appl. No.: 08/853,075

(22) Filed: May 8, 1997

(51) Int. Cl.[7] ............................. G06F 17/10; H03H 7/30
(52) U.S. Cl. ....................... 708/300; 708/322; 708/323; 375/232
(58) Field of Search ............... 364/724.2, 724.011, 364/724.16, 724.19; 375/350, 232, 233, 246, 341, 349; 708/322, 313, 318, 321, 300

(56) References Cited

U.S. PATENT DOCUMENTS

| 4,328,585 A | * | 5/1982 | Monsen ........................ 375/14 |
| 4,377,793 A | * | 3/1983 | Horna ........................ 333/165 |
| 5,245,561 A | | 9/1993 | Sugiyama |
| 5,381,354 A | | 1/1995 | Soloff |
| 5,402,520 A | * | 3/1995 | Schnitta ........................ 395/22 |
| 5,426,704 A | | 6/1995 | Tamamura et al. |
| 5,517,435 A | * | 5/1996 | Sugiyama ............... 364/724.19 |
| 5,615,233 A | * | 3/1997 | Baum et al. ................ 375/350 |

* cited by examiner

*Primary Examiner*—Tim Vo
(74) *Attorney, Agent, or Firm*—Williams, Morgan & Amerson, P.C.

(57) ABSTRACT

A signal processor includes an adaptive filter that generates an output signal as a function of an input signal and of weighting coefficients stored in a memory. An error detector generates an error signal as a function of the output signal. The error signal is used in adjusting the weighting coefficients. A data processor adjusts the number of weighting coefficients of the adaptive filter and system resources used for storing the weighting coefficients as a function of a characteristic of the weighting coefficients.

29 Claims, 9 Drawing Sheets

SIGNAL PROCESSING ARRANGEMENT INCLUDING VARIABLE LENGTH ADAPTIVE FILTER AND METHOD THEREFOR

FIELD OF THE INVENTION

The present invention is directed to arrangements and methods for processing signals. More particularly, the present invention is directed to signal processing arrangements and methods incorporating adaptive filters.

BACKGROUND OF THE INVENTION

Many signal processing application environments use filters to reduce the amount of noise present in an input signal. Such filters often involve using, for example, finite impulse response (FIR) filters having delay, multiplication, and accumulation arrangements known as taps. These taps are characterized by coefficients selected to reduce the contribution of noise to the signal output by the filter. Reducing the contribution of noise to the output signal results in a cleaner output signal.

Some filters, known as adaptive filters, can adjust to varying noise characteristics by, for example, adjusting the coefficients of the FIR filter. Signal processing techniques incorporating adaptive filters are used in a variety of applications, including speaker phones and echo cancellers. Adaptive filtering techniques involve using adaptive or corrective algorithms that compare the output signal with certain desired characteristics, such as a reference signal, and adjust the tap coefficients accordingly.

While an adaptive filter can adjust the tap coefficients of the FIR filter, the number of taps or length of the filter is typically established when the filter is designed. Selecting the length of the adaptive filter at this stage often requires the filter designer to estimate the worst-case scenario, for example, the maximum amount of noise that can be expected to be present in the input signal. The designer then selects the length of the adaptive filter to substantially remove the noise present in the worst-case scenario. To allow for a certain amount of uncertainty, adaptive filters are often designed to remove noise in situations worse than the predicted worst-case scenario. Designing the adaptive filter for performance under these conditions often results in an adaptive filter having more taps than are necessary to remove noise under many operating conditions.

Excessively long adaptive filters are susceptible to a number of inefficiencies. For example, processor and memory requirements increase as the length of the adaptive filter increases. Furthermore, increasing the number of taps in an adaptive filter increases the power consumption of the signal processor, resulting in increased device heating and electrical noise. These difficulties are 5compounded in signal processing systems incorporating multiple adaptive filters.

Another difficulty occurs when the amount of noise in the input signal of an adaptive filter exceeds design expectations. When the input signal contains more noise than expected in the worst-case scenario, the adaptive filter may be unable to remove the noise from the input signal. As a result, the performance of the adaptive filter may deteriorate. For example, perceived speech quality during a telephone conversation may suffer.

SUMMARY OF THE INVENTION

According to one embodiment, the present invention is directed to a signal processing arrangement. The signal processing arrangement includes an adaptive filter, which is coupled to receive an input signal. The adaptive filter is configured and arranged to generate an output signal as a function of the input signal and a number of weighting coefficients. A memory stores the weighting coefficients. An error detector is responsive to the output signal and is configured and arranged to generate an error signal. The error signal is generated at least in part as a function of the output signal and is provided to the adaptive filter. A data processor is operatively coupled to the adaptive filter and is configured and arranged to selectively modify the weighting coefficients in response to the error signal and to selectively increase or decrease the number of weighting coefficients in response to a characteristic of the weighting coefficients. The data processor also selectively modifies an amount of system resources used for storing the weighting coefficients.

Another embodiment of the present invention is directed to a signal processing arrangement including adaptive filters that are coupled to receive input signals. The adaptive filters are configured and arranged to generate output signals as a function of the input signals and of sets of weighting coefficients of the adaptive filters. Error detectors, responsive to the output signals, generate error signals at least in part as a function of the output signals and provide the error signals to the adaptive filters. A memory is configured and arranged to store the weighting coefficients. A data processor is operatively coupled to the adaptive filters and is configured and arranged to selectively modify the weighting coefficients in response to the error signals and to selectively increase or decrease quantities of weighting coefficients comprising the sets of weighting coefficients in response to a characteristic of the weighting coefficients. The data processor is also configured and arranged to allocate system resources among the adaptive filters.

According to a method embodiment of the present invention, signal processing is accomplished by receiving an input signal. An output signal is generated using an adaptive filter as a function of the input signal and a number of weighting coefficients stored in a memory, and an error signal is generated at least in part as a function of the output signal. The method includes selectively modifying the weighting coefficients in response to the error signal and selectively increasing or decreasing the number of weighting coefficients used by the adaptive filter in response to a characteristic of the weighting coefficients. An amount of system resources used for storing the weighting coefficients is also selectively modified. This method may be performed using a signal processing arrangement.

Another signal processing method includes receiving input signals and using adaptive filters to generate output signals as a function of the input signals and of sets of weighting coefficients stored in a memory. Error signals are generated at least in part as a function of the output signals. The weighting coefficients are selectively modified in response to the error signals, and quantities of weighting coefficients comprising the sets of weighting coefficients are selectively increased or decreased in response to the weighting coefficients. The method also includes allocating space in the memory among the adaptive filters. This method may be performed using a signal processing arrangement.

The above summary of the invention is not intended to describe each disclosed embodiment of the present invention. This is the purpose of the figures and of the detailed description that follows.

BRIEF DESCRIPTION OF THE DRAWINGS

Other aspects and advantages of the present invention will become apparent upon reading the following detailed description and upon reference to the drawings in which.

Figure 1:
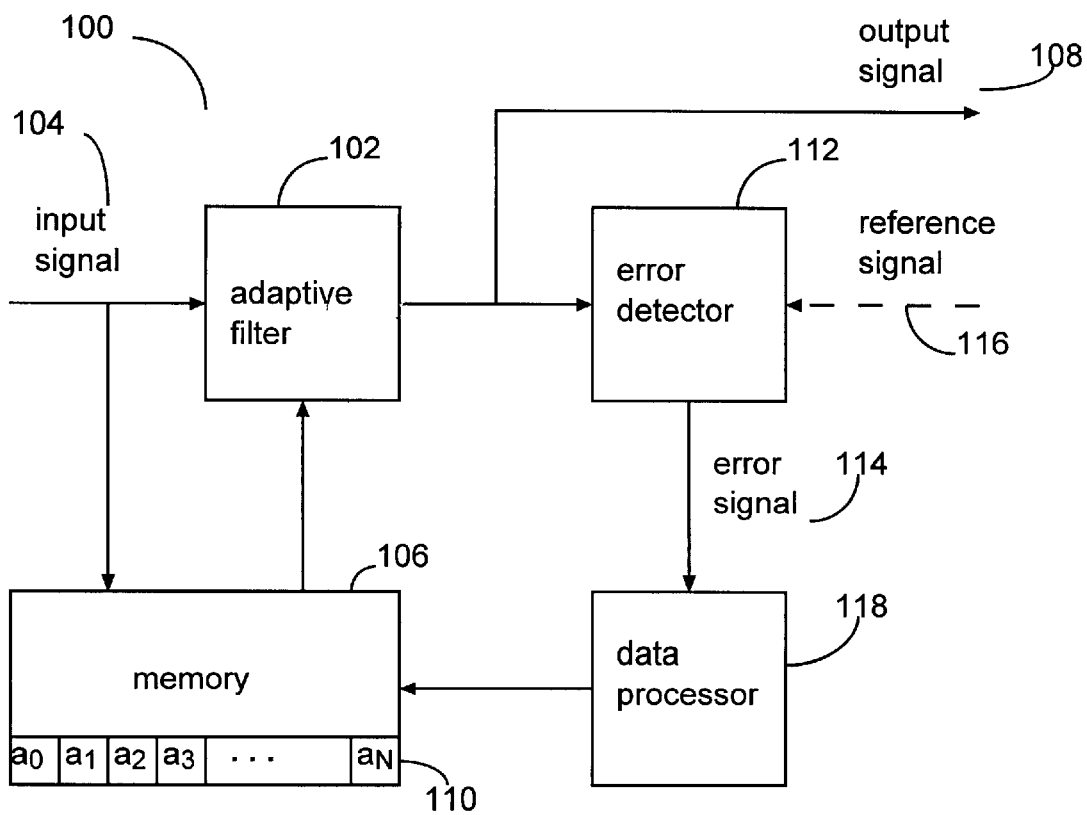
FIG. 1 is a block diagram of a signal processing arrangement according to one embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a variety of systems and arrangements that process signals. The invention has been found to be particularly advantageous in application environments using adaptive filters to remove noise from signals. An appreciation of various aspects of the invention is best gained through a discussion of various application examples operating in such an environment.

Figure 3:
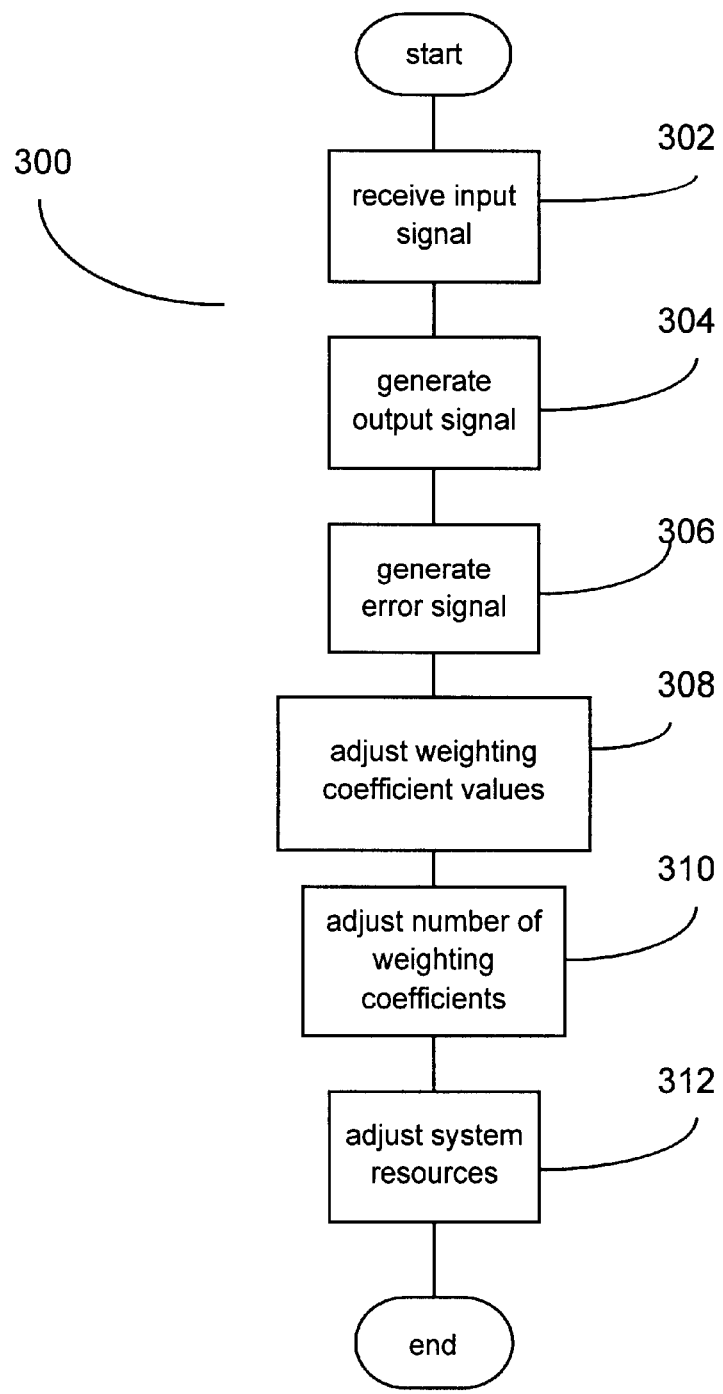
FIG. 3 is a flow chart of a signal processing method according to yet another embodiment of the present invention.

FIGS. 1 and 3 respectively illustrate an example signal processing arrangement 100 and method of operation 300 according to one embodiment of the present invention. The signal processing arrangement 100 includes an adaptive filter 102 that receives an input signal 104, as depicted at a block 302 of FIG. 3. The adaptive filter 102 may be implemented using any of a variety of hardware and software arrangements, including, for example, a computer-based arrangement and an application program. A memory 106, such as a random access memory (RAM), stores data from the input signal 104. For example, the memory 106 stores a history of the input signal 104. The history of the input signal 104 is provided to the adaptive filter 102.

Figure 5:
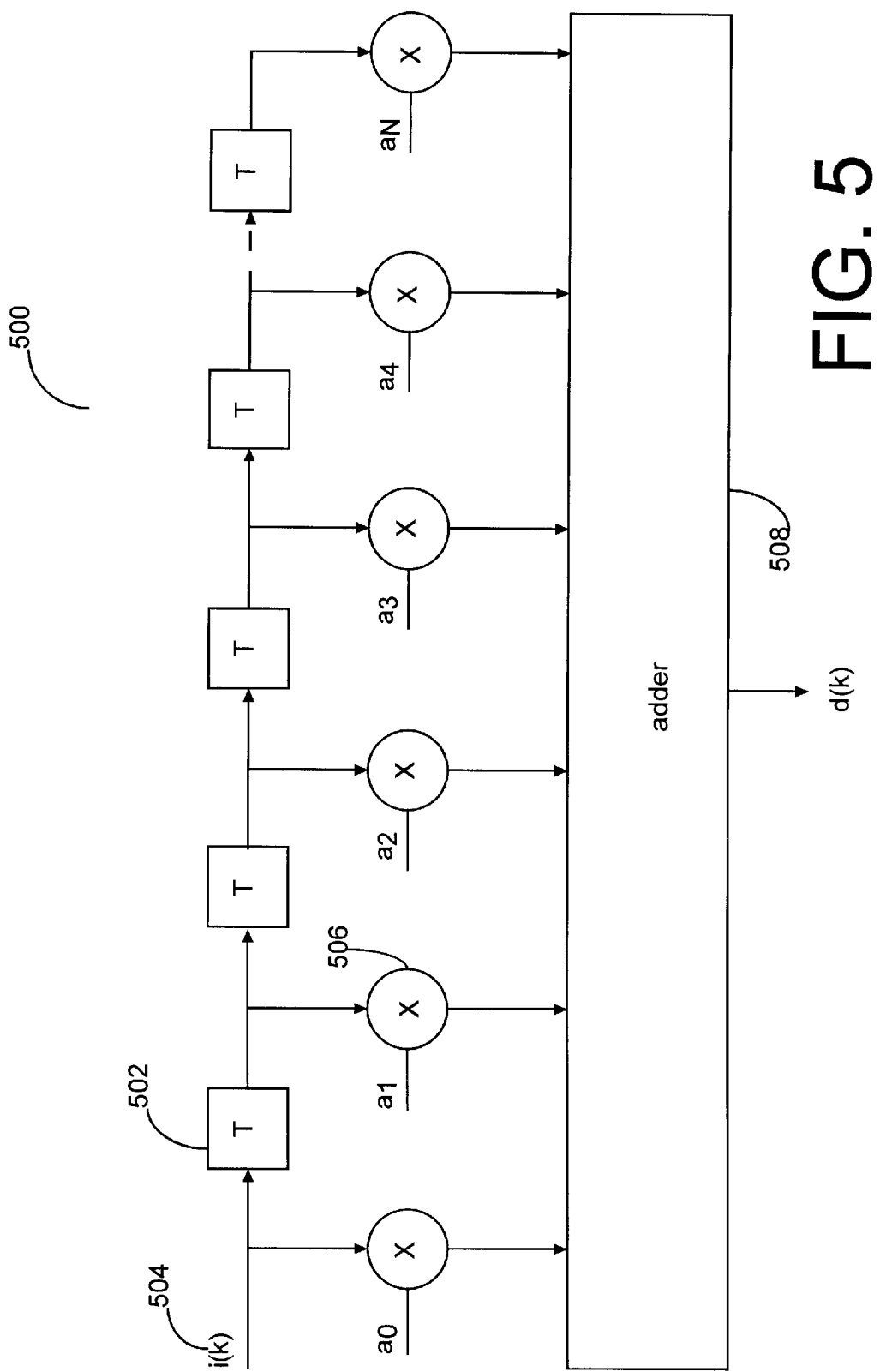
FIG. 5 is a block diagram of an adaptive filtering arrangement according to the present invention.

As depicted at a block 304 of FIG. 3, the adaptive filter 102 generates an output signal 108 based on the input signal 104 and the history of the input signal 104. The adaptive filter 102 generates the output signal 108 using, for example, a FIR filter using coefficients $a_0, a_1, a_2, \ldots, a_N$ stored at locations 110 of the memory 106. It should be understood that these coefficients may be real- or complex-valued. FIG. 5 illustrates an example adaptive filtering arrangement 500 that may be used to implement the adaptive filter 102. The adaptive filtering arrangement 500 includes delay elements 502 that impart various degrees of delay to an input signal 504 as it propagates through the adaptive filtering arrangement 500. As the input signal 504 propagates through the adaptive filtering arrangement 500, multipliers 506 multiply values of the input signal 504 at various instants by the coefficients $a_0, a_1, a_2, \ldots, a_N$. An adder 508 then sums the products thus obtained to generate an output signal d(k). Accordingly, the adaptive filtering arrangement 500 generates the output signal d(k) represented, for example, by the relationship:

$$d(k) = \sum_{j=0}^{N} a_j i(k-j)$$

where i(k) represents the instantaneous value of the input signal 504 during the $k^{th}$ interval, N is the number of taps less one (e.g., for a 200-tap filter, N=199), and j is an index variable ranging from zero to N. While FIG. 5 illustrates the adaptive filtering arrangement 500 implemented as a FIR filter, it should be understood that other filter types may be used.

Initially, the number of coefficients is selected to meet certain design criteria. For example, the designer typically considers the expected amount of noise present in the input signal in determining the initial number of coefficients or length of the adaptive filter 102. Each filter coefficient occupies space in the memory 106 and consumes other computing resources, such as processor cycles. Furthermore, additional space in the memory 106 is also used to store the history of the signal as the number of coefficients increases. Each coefficient also increases the amount of noise generated by the filter and the power consumption of the filter. It is therefore desirable, in many applications, to limit the number of taps of the adaptive filter 102 to an efficient amount to avoid dedicating system resources to taps that contribute little to the output signal 108. These system resources can then be allocated to other system tasks, such as running other software applications or maintaining additional adaptive filters. Limiting the number of taps of the adaptive filter 102 also reduces the system resources involved in storing and processing the history of the signal. Furthermore, by reducing the number of filter taps, the signal processing arrangement 100 can reduce power consumption and electrical noise generated by the adaptive filter 102. In addition, input generated by the system may be reduced.

To improve the efficiency of the adaptive filter 102, the signal processing arrangement 100 adjusts the number of coefficients of the adaptive filter 102 as well as the coefficient values themselves. An error detector 112 receives the output signal 108 and generates an error signal 114 based on knowledge of desired characteristics of the output signal 108, as depicted at a block 306 of FIG. 3. For example, the error detector 112 may receive a reference signal 116 and provide the error signal 114 to a data processor 118. The data processor 118 may be implemented using, for example, a computer arrangement or a microcontroller. It should be understood, however, that other arrangements may be used to implement the data processor 118. Alternatively, the data processor 118 could include the error detector 112, the adaptive filter 102, or both. Based on the error signal 114, the data processor 118 adjusts the values of the coefficients $a_0$ through $a_N$ and stores the new coefficient values in the memory 106.

The data processor 118 adjusts the coefficient values at a block 308 of FIG. 3 using any of a variety of techniques. For example, the data processor 118 may use a least mean squares (LMS) optimization technique. This technique attempts to find the coefficient values that minimize the mean squared error between, for example, the noise in the input signal 104 and an estimate of the noise in the input signal 104. It should be understood that other optimization techniques may be used to adjust the coefficient values. For example, the data processor 118 could use a recursive least squares (RLS) technique.

The data processor 118 also adjusts the number of coefficients $a_0$ through $a_N$ of the adaptive filter 102, as depicted at a block 310 of FIG. 3. The data processor 118 monitors the coefficient values and eliminates coefficients that do not contribute significantly to the output signal 108. For example, the data processor 118 may eliminate coefficients having relatively low positive or negative magnitudes. In this manner, the length of the adaptive filter 102 is reduced when certain coefficients are relatively unused. Reducing the length of the adaptive filter 102 in these situations prevents the signal processing arrangement 100 from wasting computing resources, such as space in the memory 106 and eliminates the processing overhead and power consumption associated therewith. Because reducing the amount of power consumed by the signal processing arrangement 100 reduces the amount of heat generated, there may also be a corresponding reduction in the electrical power and costs associated with cooling the signal processing arrangement 100. In addition, system malfunctions attributable to excessive heating are reduced.

Figure 6:
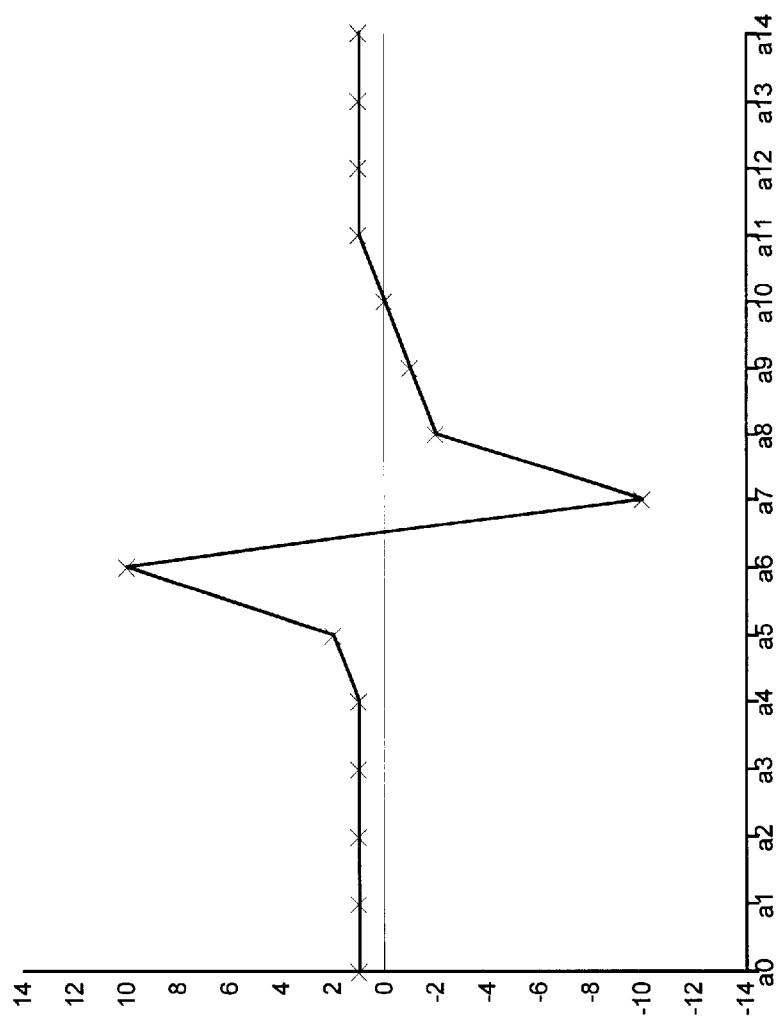
FIGS. 6–9 are charts illustrating example data for use in connection with various embodiments of the present invention.

FIG. 6 illustrates an example situation in which the data processor 118 may reduce the length of the adaptive filter 102 to use the system resources more efficiently. The filter coefficients are depicted along the horizontal axis, and their magnitudes are illustrated along the vertical axis. In FIG. 6, the coefficients $a_0$ through $a_4$ and $a_9$ through $a_{14}$ have relatively low magnitudes compared to the coefficients $a_5$ through $a_8$. Accordingly, the data processor 118 can reduce the length of the adaptive filter 102 by eliminating the coefficients $a_0$ through $a_4$ and $a_9$ through $a_{14}$. The data processor 118 may eliminate these coefficients by, for example, releasing the memory locations 110 for use by other components of the signal processing arrangement 100. Additionally, because the coefficients $a_5$ and $a_8$ have relatively low magnitudes compared to the coefficients $a_6$ and $a_7$ the data processor 118 optionally reduces the length of the adaptive filter 102 even further by eliminating the coefficients $a_5$ and $a_8$.

Figure 7:
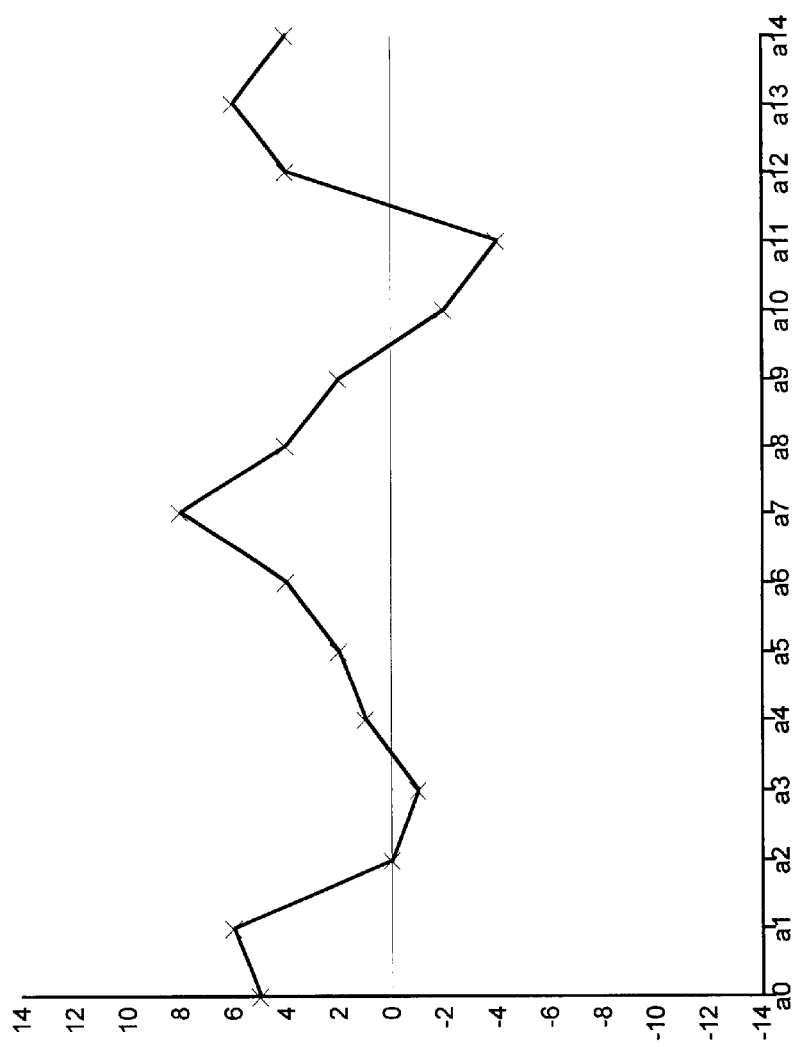

The data processor 118 also increases the length of the adaptive filter 102 in situations in which doing so would result in better noise filtering. FIG. 7 illustrates one such situation. In FIG. 7, the coefficient magnitudes do not taper off at the left and right and sides, as in FIG. 6. The relatively large magnitudes of the coefficients at both ends of the adaptive filter 102 indicate that the coefficients contribute significantly to the output signal 108. Additionally, the relatively large coefficient magnitudes indicate that noise filtering and output signal quality might be improved by adding more coefficients to the adaptive filter 102. If additional computing resources are available, e.g., the memory 106 has free space, the data processor 118 increases the number of coefficients of the adaptive filter 102. The memory 106 stores the additional coefficients.

Figure 8:
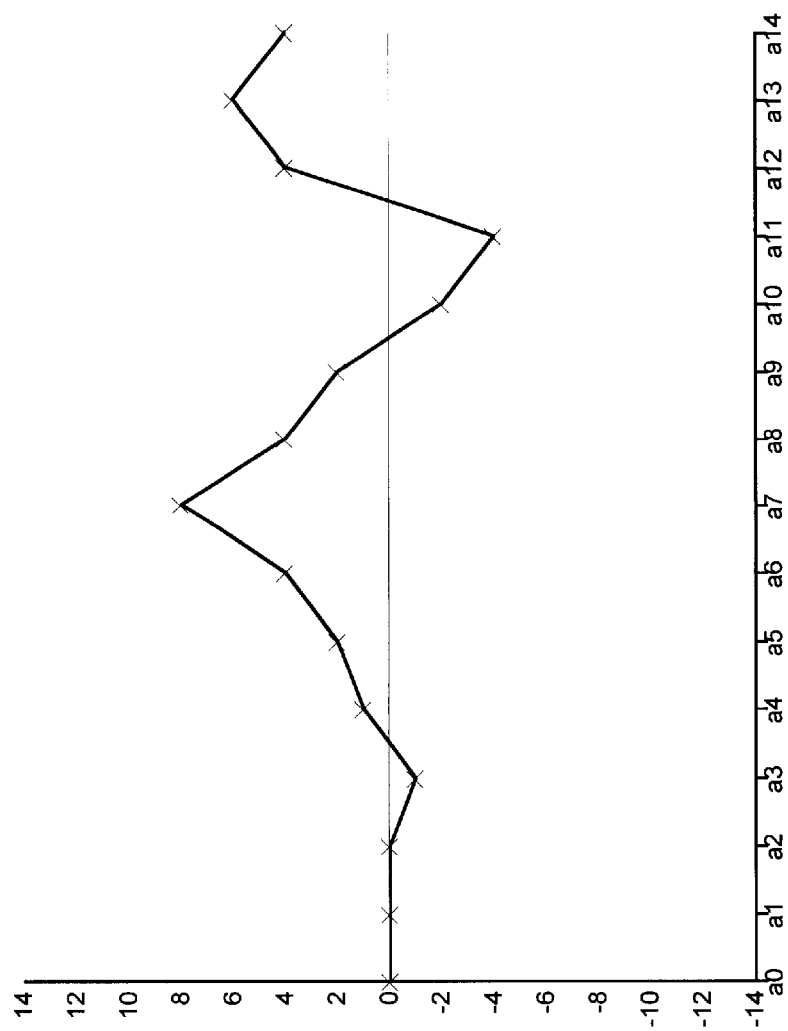

FIG. 8 illustrates an example situation in which the data processor 118 shortens the adaptive filter 102 on one end and lengthens the adaptive filter 102 on the other end. In FIG. 8, the coefficients $a_0$ through $a_2$ are zero, and the coefficient $a_3$ has a relatively low magnitude. On the other hand, the coefficient $a_{14}$ has a relatively high magnitude. Accordingly, the data processor 118 optionally eliminates the coefficients $a_0$ through $a_3$ and adds additional coefficients, e.g., $a_{15}$ and $a_{16}$ (not shown). By reconfiguring the coefficients in this manner, the data processor 118 potentially realizes more effective noise filtering without increasing the length of the adaptive filter 102. After increasing or decreasing the number of filter coefficients, the data processor 118 adjusts system resources, such as the amount of space in the memory 106 used for storing the coefficient values, as depicted at a block 312 of FIG. 3. Alternatively, the data processor 118 adjusts other system resources involved in storing the coefficient values, such as processor cycles or electrical power. As another alternative, the data processor 118 may maintain the amount of space in the memory 106 used for storing the coefficient values at a constant level and adjust the amount of data in the memory 106 that is processed by the data processor 118.

Figure 9:
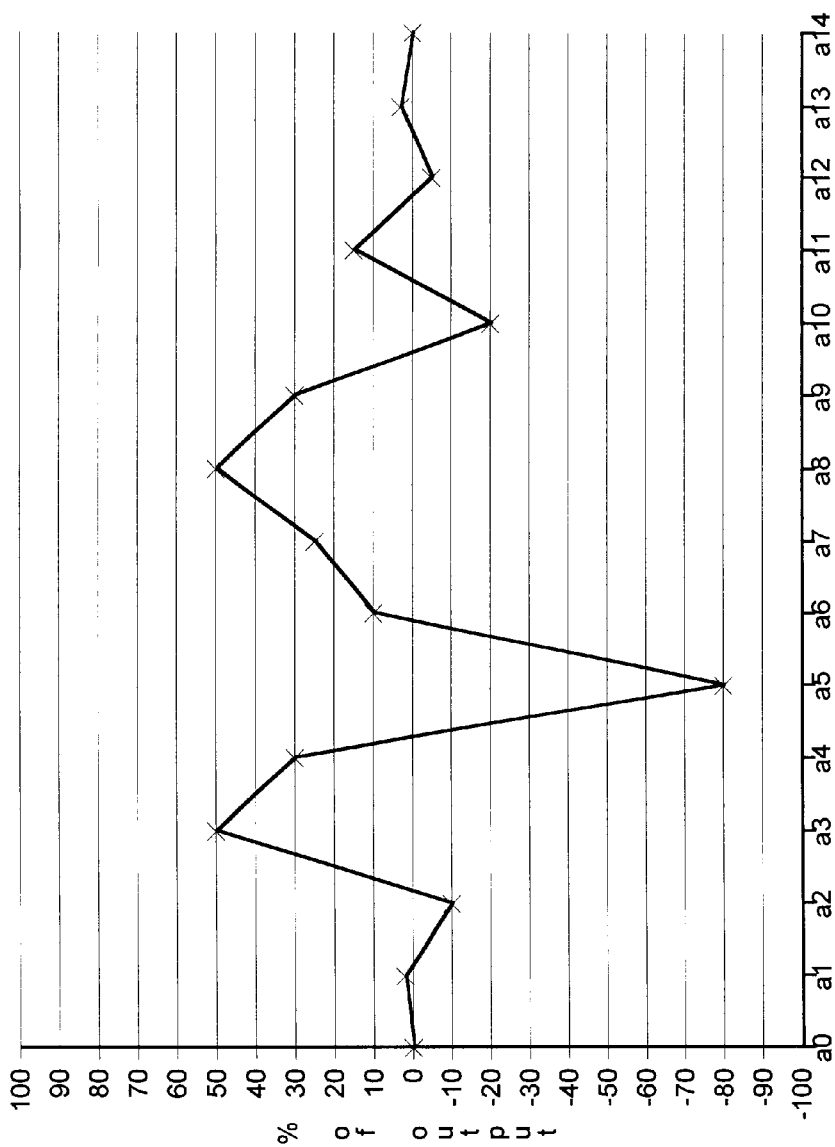

FIG. 9 illustrates another example approach to deciding whether to adjust the length of the adaptive filter 102. FIG. 9 illustrates the relative contribution of each coefficient as a positive or negative percentage of the output signal 108. Coefficients having high positive or negative relative contribution percentages contribute significantly to the output signal 108, while those coefficients that contribute little to the output signal 108 have relatively low contribution percentages. For example, the coefficients $a_0$, $a_1$, $a_{12}$, $a_{13}$, and $a_{14}$ are illustrated as contributing less than 5% of the output signal 108. Accordingly, the data processor 118 optionally reduces the length of the adaptive filter 102 by eliminating one or more of these coefficients.

This approach to deciding whether to adjust the length of the adaptive filter 102 potentially yields more accurate results than the approach discussed above in connection with FIGS. 6 through 8, but involves dedication of additional system resources. The additional system resources are used, for example, to compute the relative contributions of the coefficients to the output signal 108. To achieve a balance between accuracy and usage of system resources, the data processor 118 can use different approaches during different phases of the adaption process. For example, during one phase, known as a training phase, the adaptive filter 102 initially has little or no knowledge of the optimal coefficient values and uses a reference signal to determine the optimal coefficient values. Next, during a tracking phase, the adaptive filter 102 adjusts the number and values of the coefficients in response to the error signal. During the training phase, it is desirable to adapt quickly and accurately. Accordingly, the data processor 118 optionally adjusts the number and values of the coefficients as a function of the relative contributions of the coefficients.

When adjusting the coefficients in response to the error signal during the tracking phase, the adaptive filter 102 typically does not update the coefficients as often or as rapidly as during the training phase. The data processor 118 can therefore reduce resource usage by adjusting the number and values of the coefficients as a function of the coefficient values. Using this approach conserves computing resources and electrical power after the filter coefficients have stabilized.

Figure 2:
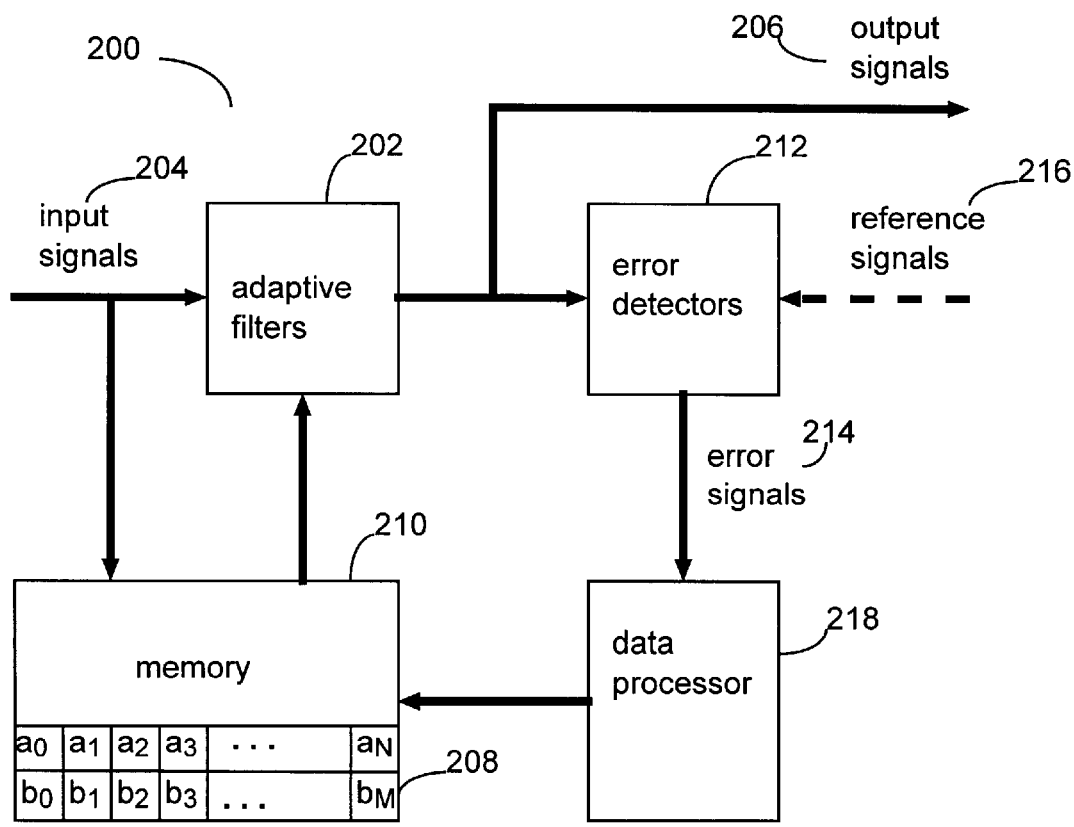
FIG. 2 is a block diagram of a signal processing arrangement according to another embodiment of the present invention.
Figure 4:
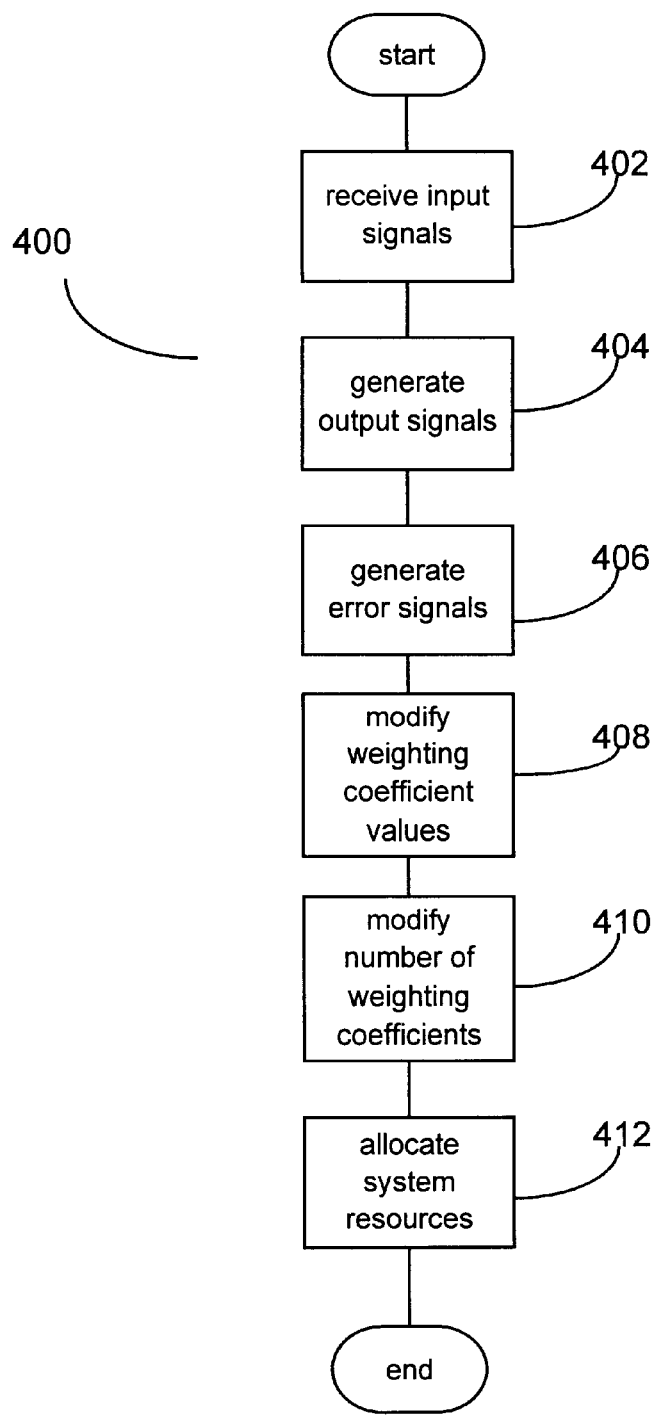
FIG. 4 is a flow chart of a signal processing method according to still another embodiment of the present invention.

FIGS. 2 and 4 respectively illustrate an example signal processing arrangement 200 and method of operation 400 that incorporate multiple adaptive filters 202. The signal processing arrangement 200 may be incorporated, for example, in a multitasking computer that allocates its resources among several simultaneous tasks, including multiple adaptive filters 202. The adaptive filters 202 may be implemented using, for example, an appropriately programmed computer arrangement. The adaptive filters 202 receive input signals 204 at a block 402 of FIG. 4 and generate output signals 206 using coefficients $a_0$ through $a_N$ and $b_0$ through $b_M$ stored in locations 208 of a memory 210, as depicted at a block 404. It should be understood that if more than two adaptive filters 202 are present in the signal processing arrangement 200, the memory 210 stores a set of coefficients for each adaptive filter 202.

At a block 406, error detectors 212 generate error signals 214 as a function of the output signals 206 and, for example, reference signals 216. A data processor 218 adjusts the coefficient values for the adaptive filters 202 based on the error signals 214 at a block 408 using, for example, an LMS optimization algorithm. The data processor 218 also adjusts the number of coefficients or length of each adaptive filter 202 based on the coefficient values, as depicted at a block 410. The data processor 218 eliminates coefficients that contribute relatively little to the output signals and adds additional coefficients when it determines that filter performance would be improved by dedicating more system resources to the adaptive filters. This adjustment is performed as discussed above in connection with FIGS. 6 through 9. After adjusting the length of the adaptive filters, the data processor 218 allocates system resources, such as space in the memory 210, to each adaptive filter, as depicted at a block 412 of FIG. 4.

The present invention is particularly advantageous in application environments in which the adaptive filters 202 share common system resources, such as processor cycles of a single data processor 218, space in the memory 210, electrical power, or cooling resources. The data processor 218 reduces the length of the adaptive filters 202 by releasing system resources. These resources may be used to increase the length of other adaptive filters 202. By allocating system resources among the various adaptive filters 202, the data processor 218 ensures that the system resources are used efficiently. For example, system resources that do not significantly contribute to the output signal 206 are reallocated to increase their contribution to the output signal 206, thus increasing the efficiency of the adaptive filter 202. Sharing system resources also ensures that the signal processing arrangement 200 can effectively filter noise from the input signals 204 so long as the overall system has sufficient resources.

By sharing system resources, the signal processing arrangement 200 reduces power consumption and heating of system components. These realized efficiencies are particularly significant in certain applications, such as modem pools located at a single site. In this environment, the resources are dedicated to the particular modems. Accordingly, advantages may not be realized by reducing resources used since the freed up memory, for example, cannot be made available to other tasks. However, reducing the amount of heat generated by the individual modems in such a modem pool decreases the cooling resources, such as electrical power, required to maintain proper system operation and can represent significant cost savings. With each modem designed and operating using worst case resources, in the aggregate, significantly greater resources are used than are typically necessary at a given time. These resources generate unnecessary heat and waste cooling energy.

The various embodiments described above are provided by way of illustration only and should not be construed to limit the invention. Those skilled in the art will readily recognize various modifications and changes that may be made to the present invention without strictly following the example embodiments and applications illustrated and described herein, and without departing from the true spirit and scope of the present invention, which is set forth in the following claims.

What is claimed is:

1. A signal processing arrangement, comprising:
   an adaptive filter, coupled to receive an input signal and configured and arranged to generate an output signal as a function of the input signal and a number of weighting coefficients;
   a memory, configured and arranged to store the weighting coefficients;
   an error detector, responsive to the output signal and configured and arranged to generate an error signal at least in part as a function of the output signal and to provide the error signal to the adaptive filter; and
   a data processor, operatively coupled to the adaptive filter and configured and arranged to
   selectively modify the weighting coefficients in response to the error signal,
   selectively increase or decrease the number of weighting coefficients used by the adaptive filter in response to a characteristic of the weighting coefficients used by the adaptive filter and no other weighting coefficients, and
   selectively allocate system resources for storing the weighting coefficients.

2. A signal processing arrangement, according to claim 1, wherein the error detector is further configured and arranged to generate the error signal at least in part as a function of at least one of a desired characteristic of the output signal and a reference signal.

3. A signal processing arrangement, according to claim 1, wherein the data processor is configured and arranged to selectively decrease the number of weighting coefficients used by the adaptive filter in response to at least some of the weighting coefficients used by the adaptive filter having relatively low magnitudes as compared to other weighting coefficients used by the adaptive filter.

4. A signal processing arrangement, according to claim 1, wherein the data processor is configured and arranged to selectively increase the number of weighting coefficients used by the adaptive filter in response to at least some of the weighting coefficients used by the adaptive filter having relatively high magnitudes as compared to other weighting coefficients used by the adaptive filter.

5. A signal processing arrangement, according to claim 1, wherein the data processor is further configured and arranged to
   selectively increase the number of weighting coefficients used by the adaptive filter by requesting space in the memory for storing additional weighting coefficients; and
   selectively decrease the number of weighting coefficients used by the adaptive filter by releasing space in the memory.

6. A signal processing arrangement, according to claim 1, wherein the adaptive filter includes at least one of a multiplication arrangement, an addition arrangement, and a delay arrangement.

7. A signal processing arrangement, according to claim 1, wherein the characteristic of the weighting coefficients is a magnitude of one of the weighting coefficients.

8. A signal processing arrangement, according to claim 1, wherein the characteristic of the weighting coefficients is a relative contribution of one of the weighting coefficients to the output signal.

9. A signal processing arrangement, according to claim 1, further comprising:
   a second adaptive filter, coupled to receive a second input signal and configured and arranged to generate a second output signal as a function of the second input signal and a number of second weighting coefficients; and a second error detector, responsive to the second output signal and configured and arranged to generate a second error signal at least in part as a function of the second output signal and to provide the second error signal to the second adaptive filter, wherein the memory is further configured and arranged to store the set of second weighting coefficients, and the data processor is further configured and arranged to selectively modify the second weighting coefficients in response to the second error signal, selectively increase or decrease the number of second weighting coefficients used by the second adaptive filter in response to a characteristic of the second weighting coefficients used by the second adaptive filter and no other weighting coefficients, and allocate system resources between the adaptive filter and the second adaptive filter.

10. The signal processing arrangement according to claim 1, wherein the weighting coefficients include two ends and the data processor is configured and arranged to add or remove weighting coefficients at one of the ends.

11. The signal processing arrangement according to claim 1, wherein the weighting coefficients include two ends and the data processor is configured and arranged to add or remove weighting coefficients at both ends.

12. The signal processing arrangement according to claim 1, wherein the weighting coefficients include a first end and a second end and the data processor is configured and arranged to add weighting coefficients at the first end and remove weighting coefficients at the second end.

13. The signal processing arrangement according to claim 1, wherein the signal processing arrangement includes a training phase and a tracking phase, wherein the data processor is configured and arranged to adjust the number and value of the weighting coefficients in response to a reference signal during the training phase and in response to the error signal in the tracking phase.

14. A signal processing arrangement, according to claim 9, wherein the data processor is configured and arranged to selectively decrease the number of second weighting coefficients used by the adaptive filter in response to at least some of the second weighting coefficients having relatively low magnitudes as compared to other second weighting coefficients.

15. A signal processing arrangement, according to claim 9, wherein the data processor is configured and arranged to selectively increase the number of second weighting coefficients used by the adaptive filter in response to at least some of the second weighting coefficients having relatively high magnitudes as compared to other second weighting coefficients.

16. A signal processing arrangement, according to claim 9, wherein the data processor is further configured and arranged to selectively increase the number of second weighting coefficients used by the second adaptive filter by requesting space in the memory for storing additional second weighting coefficients; and selectively decrease the number of second weighting coefficients used by the second adaptive filter by releasing space in the memory.

17. A signal processing arrangement, comprising:

a plurality of adaptive filters, coupled to receive input signals and configured and arranged to generate output signals as a function of the input signals and respective sets of weighting coefficients of the adaptive filters;

a plurality of error detectors, responsive to the output signals and configured and arranged to generate error signals at least in part as a function of the output signals and to provide the error signals to the adaptive filters;

a memory, configured and arranged to store the respective sets of weighting coefficients; and a data processor, operatively coupled to the adaptive filters and configured and arranged to selectively modify the weighting coefficients in response to the error signals, selectively increase or decrease, for each set of weighting coefficients, the number of weighting coefficients for a particular set of weighting coefficients in response to a characteristic of the particular set of weighting coefficients and no other set of weighting coefficients, and allocate system resources among the adaptive filters.

18. A signal processing method, comprising:

receiving an input signal;

using an adaptive filter to generate an output signal as a function of the input signal and a number of weighting coefficients stored in a memory;

generating an error signal at least in part as a function of the output signal;

selectively modifying the weighting coefficients in response to the error signal;

selectively increasing or decreasing the number of weighting coefficients in response to a characteristic of the weighting coefficients used by the adaptive filter and no other weighting coefficients; and selectively allocating system resources for storing the weighting coefficients.

19. A signal processing method, according to claim 18, further comprising generating the error signal at least in part as a function of at least one of a desired characteristic of the output signal and a reference signal.

20. A signal processing method, according to claim 19, further comprising receiving the reference signal.

21. A signal processing method, according to claim 18, further comprising selectively decreasing the number of weighting coefficients in response to at least some of the weighting coefficients used by the adaptive filter having relatively low magnitudes as compared to other weighting coefficients used by the adaptive filter.

22. A signal processing method, according to claim 18, further comprising selectively increasing the number of weighting coefficients in response to at least some of the weighting coefficients used by the adaptive filter having relatively high magnitudes as compared to other weighting coefficients used by the adaptive filter.

23. A signal processing method, according to claim 18, further comprising storing the weighting coefficients in the memory.

24. A signal processing method, according to claim 23, further comprising:

selectively requesting space in the memory for storing additional weighting coefficients; and selectively releasing space in the memory.

25. A signal processing method, according to claim 18, wherein the characteristic of the weighting coefficients is a magnitude of one of the weighting coefficients.

26. A signal processing method, according to claim 18, wherein the characteristic of the weighting coefficients is a relative contribution of one of the weighting coefficients to the output signal.

27. A signal processing method, comprising:

receiving input signals;

using adaptive filters to generate output signals as a function of the input signals and respective sets of weighting coefficients stored in a memory;

generating error signals at least in part as a function of the output signals;

selectively modifying the weighting coefficients in response to the error signals;

selectively increasing or decreasing, for each set of weighting coefficients, the number of weighting coefficients for a particular set of weighting coefficients in response to a characteristic of the particular set of weighting coefficients and no other set of weighting coefficients; and allocating system resources among the adaptive filters.

28. A signal processing arrangement, comprising:

means for receiving an input signal;

generating means for generating an output signal as a function of the input signal and a number of weighting coefficients stored in a memory;

means for generating an error signal at least in part as a function of the output signal;

means for selectively modifying the weighting coefficients in response to the error signal;

means for selectively increasing or decreasing the number of weighting coefficients in response to a characteristic of the weighting coefficients used by the generating means and no other weighting coefficients; and means for selectively allocating system resources for storing the weighting coefficients.

29. A signal processing arrangement, comprising:

means for receiving input signals;

means for generating output signals as a function of the input signals and respective sets of weighting coefficients stored in a memory;

means for generating error signals at least in part as a function of the output signals;

means for selectively modifying the weighting coefficients in response to the error signals;

means for selectively increasing or decreasing, for each set of weighting coefficients, the number of weighting coefficients for a particular set of weighting coefficients in response to a characteristic of the particular set of weighting coefficients and no other set of weighting coefficients; and means for allocating system resources among the means for generating the output signals.

* * * * *